United States Patent
Tsai et al.

(10) Patent No.: US 7,462,925 B2
(45) Date of Patent: Dec. 9, 2008

(54) METHOD AND APPARATUS FOR STACKING ELECTRICAL COMPONENTS USING VIA TO PROVIDE INTERCONNECTION

(75) Inventors: Chen Jung Tsai, Hsinchu (TW); Chih Wen Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 389 days.

(21) Appl. No.: 10/987,468

(22) Filed: Nov. 12, 2004

(65) Prior Publication Data

US 2006/0102993 A1    May 18, 2006

(51) Int. Cl.
*H01L 23/495* (2006.01)
*H01L 23/02* (2006.01)

(52) U.S. Cl. ............... 257/676; 257/686; 257/E23.031; 257/E23.04

(58) Field of Classification Search ................ 257/774, 257/777, 686, 673, 676, 666, 698, 779, 778; 438/109, 123, 612
See application file for complete search history.

(56) References Cited

U.S. PATENT DOCUMENTS

| | | | |
|---|---|---|---|
| 5,323,060 A | 6/1994 | Fogal et al. | |
| 5,682,062 A * | 10/1997 | Gaul | 257/686 |
| 5,998,864 A | 12/1999 | Khandros et al. | |
| 6,087,719 A * | 7/2000 | Tsunashima | 257/686 |
| 6,236,115 B1 * | 5/2001 | Gaynes et al. | 257/774 |
| 6,239,495 B1 * | 5/2001 | Sakui et al. | 257/777 |
| 6,448,661 B1 * | 9/2002 | Kim et al. | 257/777 |
| 6,465,734 B2 * | 10/2002 | Yamada et al. | 174/549 |
| 6,577,013 B1 | 6/2003 | Glenn et al. | |
| 6,608,371 B2 * | 8/2003 | Kurashima et al. | 257/686 |
| 6,624,506 B2 * | 9/2003 | Sasaki et al. | 257/686 |
| 6,717,251 B2 * | 4/2004 | Matsuo et al. | 257/686 |
| 6,809,421 B1 * | 10/2004 | Hayasaka et al. | 257/777 |
| 6,903,443 B2 * | 6/2005 | Farnworth et al. | 257/621 |
| 6,908,785 B2 * | 6/2005 | Kim | 438/106 |
| 7,074,703 B2 * | 7/2006 | Fukazawa | 438/598 |
| 7,091,124 B2 * | 8/2006 | Rigg et al. | 438/667 |
| 7,215,033 B2 * | 5/2007 | Lee et al. | 257/777 |
| 7,217,995 B2 * | 5/2007 | Tsai et al. | 257/698 |

* cited by examiner

*Primary Examiner*—David A Zarneke
(74) *Attorney, Agent, or Firm*—Stout, Uxa, Buyan & Mullins, LLP

(57) ABSTRACT

An efficient chip stacking structure is described that includes a leadframe having two surfaces to each of which can be attached stacks of chips. A chip stack can be formed by placing a chip active surface on a back surface of another chip. Electrical connections between chips and leads on the leadframe are facilitated by bonding pads on chip active surfaces and by via that extend from the bonding pads through the chips to the back surfaces.

40 Claims, 17 Drawing Sheets

METHOD AND APPARATUS FOR STACKING ELECTRICAL COMPONENTS USING VIA TO PROVIDE INTERCONNECTION

BACKGROUND OF THE INVENTION

1. Field of the Invention

The present invention relates generally to multi-chip stacking fabrication methods and, more particularly, to fabrication of thin packages containing multi-chips.

2. Description of Related Art

Personal devices that require a large number of electronic components to be provided in a small volume are rapidly proliferating. A pocket-sized personal music player that includes a hard disk is only one example of such a device. Today's personal electronic devices require that more and more functionality must be provided in a relatively small space. Traditionally, this functionality was provided by multi-chip electronic devices fabricated by placing chips on a two-dimensional substrate such as a printed circuit board (PCB). As circuit density increased, methods were devised for stacking multiple chips, thereby trading a scarce resource of substrate area for space in a third dimension. Several prior-art structures for stacking multiple chips have been devised, but none has proven to be wholly satisfactory. The need to stack components typically requires fabricating a superstructure that supports the stacked components. This superstructure adds to the volume and weight, and therefore to the cost, of the component stack, thereby offsetting an advantage that may be gained by stacking. Some stacking structures make efficient use of space, but tend to be complicated and expensive to fabricate. Less complicated and expensive stacking structures may either fail to make efficient use of space and/or present problems in disposing of the heat generated by chips in a stack. Other stacking structures include delicate wires that may introduce reliability concerns. Still other stacking structures may introduce reliability concerns at the level of PCB interconnection.

A need thus exists in the prior art for a stacking structure that is efficient in its use of space while being easy to fabricate. A further need exists for a structure that achieves reliable interconnection with a PCB.

SUMMARY OF THE INVENTION

The present invention addresses these needs by providing a chip stacking structure wherein chips have via that extend through the chip, thereby obviating the need for external wires to form electrical connections either between chips or with external leads. The invention herein disclosed comprises a leadframe having a plurality of leads disposed at a periphery of the leadframe. According to an exemplary embodiment, each lead has a lead inner portion and a lead outer portion. The lead outer portion may connect reliably with a substrate such as a printed circuit board (PCB). Each lead inner portion comprises a first surface and a second surface. The invention further may comprise a first chip stack formed of at least one chip, each chip having an active surface, a back surface, a plurality of first bonding pads disposed on the active surface, and a plurality of first chip via. Each first bonding pad has a bonding wall, and each first chip via has insulating material covering an inner wall of the first chip via. The insulating material does not cover a bonding wall. Each of the plurality of first chip via extends from a first bonding pad through the chip to the back surface. This embodiment further comprises a second chip stack formed in a manner similar to the formation of the first chip stack. Chips in the second chip stack comprise active surfaces, back surfaces, second bonding pads, and second chip via. The second chip via have insulating material covering inner walls thereof. The second bonding pads have bonding walls that are not covered by insulating material. This embodiment of the chip stacking structure may be formed by filling each first chip via with conducting material that electrically connects each first bonding pad to the first surface of a lead inner portion. Similarly, each second chip via may be filled with conducting material, electrically connecting each second bonding pad to the second surface of a lead inner portion.

Another embodiment of the present invention comprises a chip stacking structure having a plurality of chip stacks, each chip stack including at least one chip. Each chip comprises an active surface, a corresponding back surface, and a plurality of bonding pads disposed on the active surface. Each bonding pad has a bonding wall. Each chip further comprises a plurality of chip via having inner walls and extending from the plurality of bonding pads through the chips to the back surfaces. Insulating material covers the inner walls but does not cover the bonding walls. The chip stacking structure further comprises a leadframe having a plurality of leads disposed at a periphery thereof with the plurality of leads having lead inner portions and lead outer portions. The lead inner portions have first surfaces and second surfaces. A first chip stack is positioned with a first active surface facing the first surfaces and with a first plurality of bonding pads aligned with and making contact with the lead inner portions. A second chip stack is positioned with a second active surface facing the second surfaces and with a second plurality of bonding pads aligned with and making contact with the lead inner portions. Conductive material electrically connects bonding walls in the first chip stack to the first surfaces. Similarly, conductive material electrically connects bonding walls in the second chip stack to the second surfaces.

The present invention further comprises a method of stacking semiconductor chips. An implementation of the method comprises providing a leadframe having a plurality of leads disposed at a periphery thereof, the plurality of leads having lead inner portions and lead outer portions. The lead inner portions have first surfaces, second surfaces, and lead via that extend through the lead inner portions. An aspect of this implementation of the method comprises providing a first chip stack comprising at least one chip having an active surface, a back surface, and a plurality of bonding pads on the active surface. Each chip further comprises a plurality of chip via extending from the plurality of bonding pads through the chip to the back surface. Another aspect of the method positions the first chip stack with a first active surface facing the first surfaces and with a first plurality of bonding pads aligned with and making contact with the inner portions. A second chip stack also is provided, the second ship stack likewise comprising at least one chip having an active surface and a back surface. Each chip in the second chip stack also has a plurality of bonding pads on the active surface and a plurality of chip via that extend from the plurality of bonding pads through the chip to the back surface. The method further comprises positioning the second chip stack with a second active surface of the second chip stack facing the second surfaces such that a second plurality of bonding pads of the second chip stack is aligned with and makes contact with the lead inner portions.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
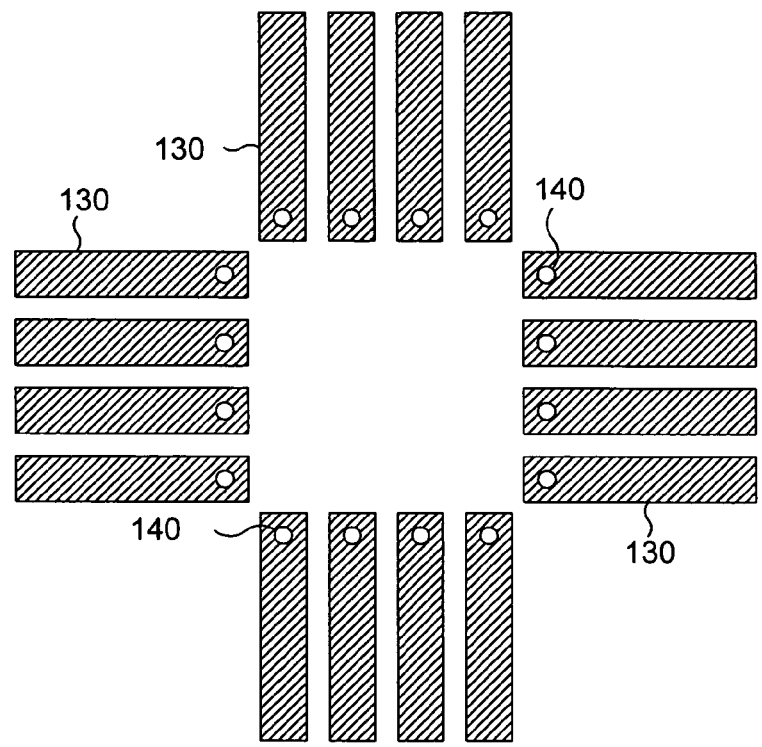
FIG. 1 is a plan view of a portion of a leadframe embodiment constructed according to the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of stacking structures. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 is a plan view of a portion of a leadframe embodiment constructed according to the present invention. The portion of the leadframe illustrated in FIG. 1 comprises a plurality of leads having lead inner portions 130. Each lead inner portion 130 may have a lead via 140 formed therein. The lead inner portions 130 are extended to reach an active surface of a chip that may be positioned to make contact with the lead inner portions 130. The lead inner portions 130 may be configured without lead via 140 in modified embodiments.

Figure 2:
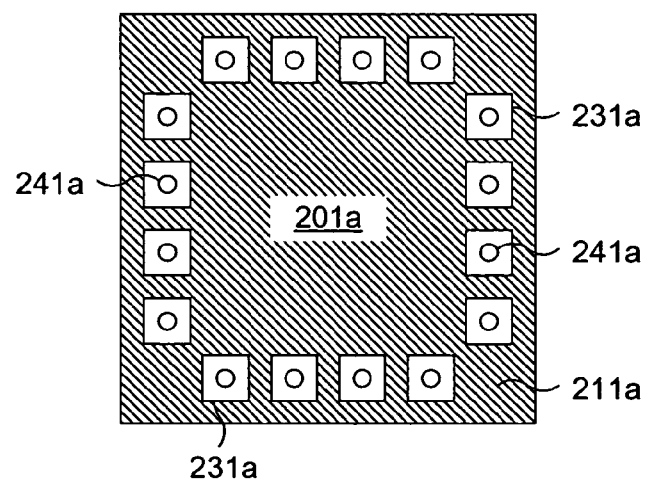
FIG. 2 is a plan view of a chip that may connect to the leads of a leadframe of the type illustrated in FIG. 1.
Figure 4:
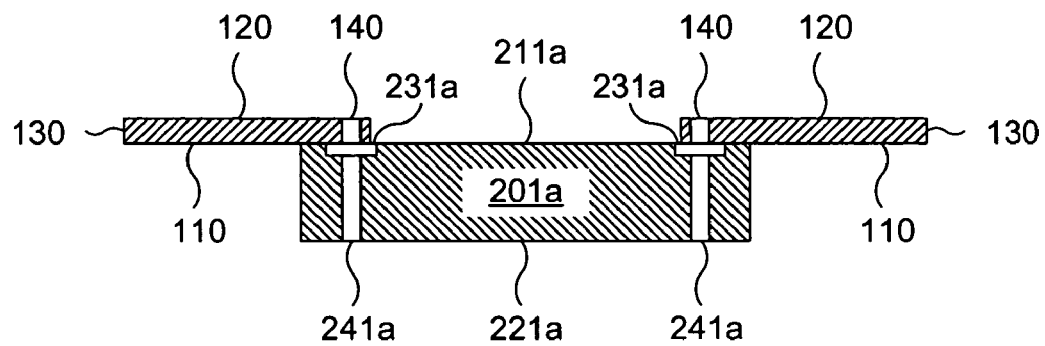
FIG. 4 is a is a cross-sectional view, taken along the line 4-4', of the chip/leadframe combination illustrated in FIG. 3.

FIG. 2 is a plan view of a chip 201a that may connect to the leads of a leadframe of the type illustrated in FIG. 1. Chip 201a has an active surface 211a and a corresponding back surface 221a (FIG. 4, infra). A plurality of first bonding pads 231a is disposed on the active surface 211a of the chip 201a. Each first bonding pad 231a has associated with it a first chip via 241a that extends from the first bonding pad 231a through the active surface 211a of the chip 201a to the back surface 221a (FIG. 4) of the chip 201a. According to a typical embodiment, the first bonding pads 231a and their associated first chip via 241a are fabricated to align with lead inner portions 130, which may comprise lead via 140 as illustrated in FIG. 1.

Figure 3:
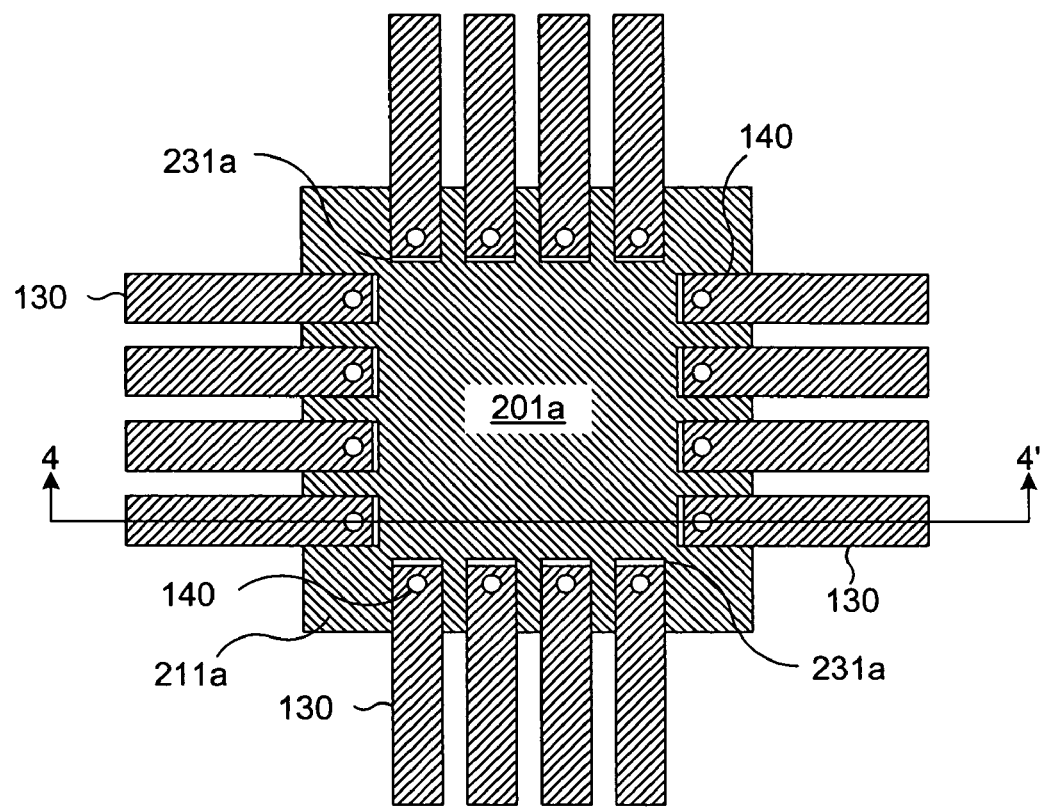
FIG. 3 is a plan view of a partial stacked structure comprising a single chip connected to the leads of a leadframe.

FIG. 3 is a plan view of a partial stacked structure comprising a single chip connected to the leads of a leadframe. The embodiment illustrated in FIG. 3 comprises a leadframe portion as illustrated in FIG. 1 placed in contact with the chip 201a illustrated in FIG. 2. Lead via 140 in the lead inner portions 130 are coaxially aligned with first chip via 241a (FIG. 2). The coaxial alignment of the first chip via 241a with the lead via 140 assures that the lead inner portions 130 also align with first bonding pads 231a on the active surface 211a of the chip 201a. The alignment of first bonding pads 231a with the lead inner portions 130 assures that first bonding pads 231a are able to establish electrical contact with the lead inner portions 130.

FIG. 4 is a cross-sectional view taken along the line 4-4' of the chip/leadframe combination illustrated in FIG. 3. This view illustrates the active surface 211a and the back surface 221a of the chip 201a. First bonding pads 231a formed on the active surface 211a connect to first chip via 241a that extend from first bonding pads 231a through the chip 201a to the back surface 221a of the chip 201a. The lead via 140 are coaxially aligned with first chip via 241a. Each lead inner portion 130 illustrated in FIG. 4 comprises a first surface 110 and a second surface 120. In the illustrated embodiment, the active surface 211a of chip 201a is secured to the first surfaces 110 of the lead inner portions 130 that form a portion of the leadframe.

An electrically conductive material such as solder may be used to fill the lead via 140 and first chip via 241a. Solder may flow over first bonding pads 231a thereby providing mechanical as well as electrical connection of the lead inner portions 130 to first bonding pads 231a. According to another embodiment (not illustrated), chip 201a has no via, and the first surface 110 of the lead inner portions 130 is secured to the active surface 211a of chip 201a by a solid or liquid adhesive.

Figure 5A:
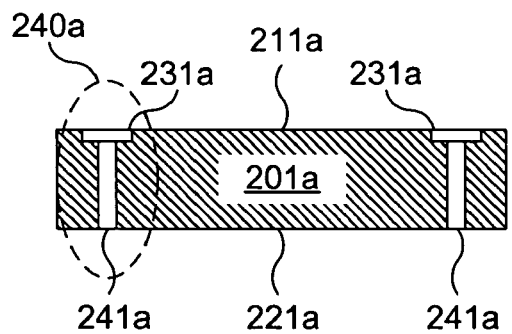
FIG. 5A is a cross-sectional view of an embodiment of a chip comprising chip via and bonding pads according to the present invention.

FIG. 5A is a cross-sectional view of an embodiment of a chip 201a comprising first chip via 241a and first bonding pads 231a according to the present invention. Although a chip may comprise many such first chip via 241a and first bonding pads 231a, only two of each are shown in FIG. 5A for clarity. A single first chip via 241a and its associated first bonding pad 231a are selected and designated as 240a for further discussion below.

Figure 5B:
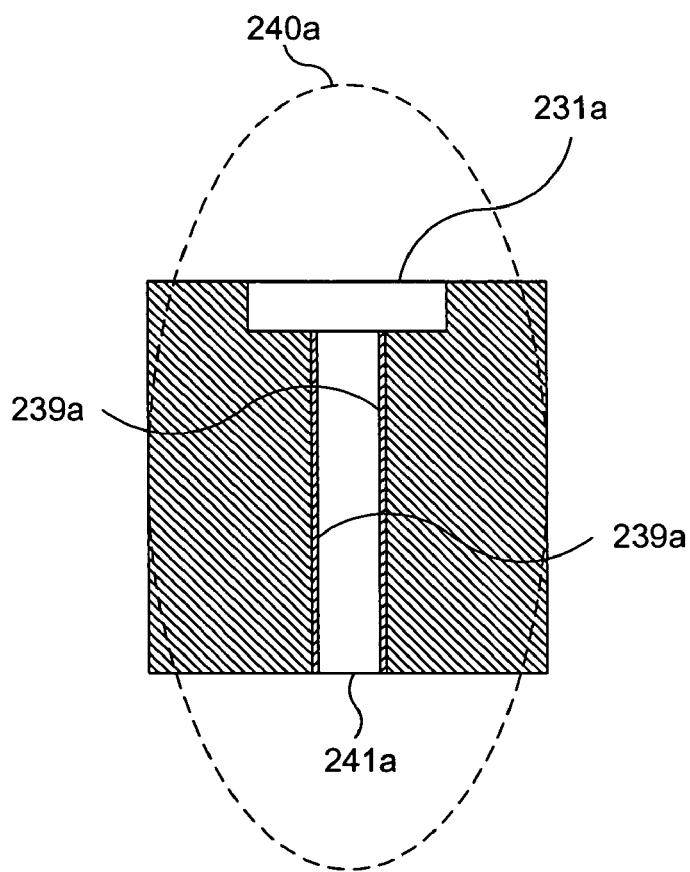
FIG. 5B is a cross-sectional view showing details of a chip via and bonding pad illustrated in FIG. 5A.

FIG. 5B is a cross-sectional view of the selected first chip via 241a and first bonding pad 231a designated as 240a in FIG. 5A. The first bonding pad 231a has a bonding wall 230a. As shown in FIG. 5B, the first chip via 241a may include an insulated coating 239a on an inner wall of the first chip via 241a. This insulated coating 239a, which does not extend to cover the bonding wall 230a of the first bonding pad 231a, can prevent electrical contact from occurring between conducting material that may be placed within the first chip via 241a and active areas internal to the chip 201a (FIG. 5A). Methods are known in the art for forming the insulated coating on the inner wall of the first chip via 241a. For example, the first chip via 241a may be formed by a burning operation performed with a laser. The laser, in burning the first chip via 241a, may do so with a temperature high enough to oxidize semiconductor material that forms the chip 201a. If the chip 201a is formed of silicon, then the oxidized semiconductor material is silicon dioxide, known to be insulating material. Although not specifically illustrated, the via illustrated in FIGS. 6, 7A-7E, 8, 9A-9F, 11, 12A-12C, 13, and 14A-14E may include insulated coatings on inner walls in a manner represented in FIG. 5B.

Figure 6:
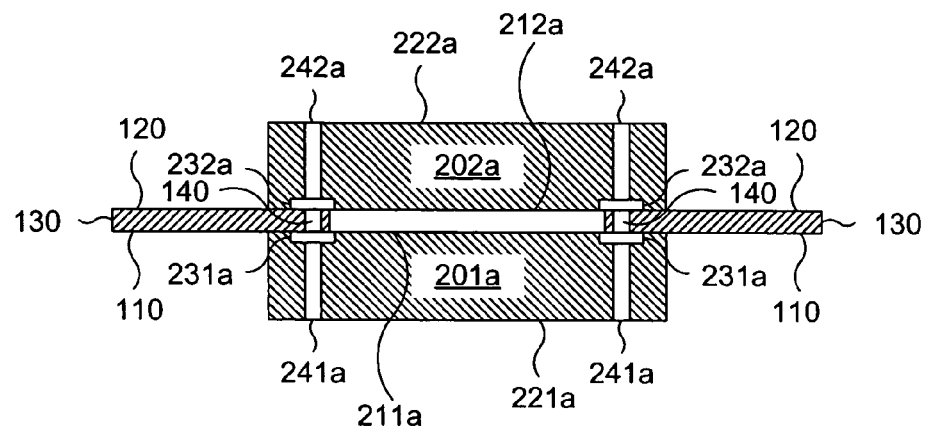
FIG. 6 is a cross-sectional view of an embodiment of two chips connected to a leadframe according to the present invention.

FIG. 6 is a cross-sectional view of an embodiment of two chips connected to a leadframe according to the present invention. The lower portion of the diagram duplicates FIG. 4 wherein chip 201a is joined with the first surfaces 110 of the lead inner portions 130 on the leadframe. In FIG. 6 another chip 202a is added to the combination. Chip 202a has an active surface 212a and a back surface 222a. The active surface 212a has formed thereon second bonding pads 232a, which connect to second chip via 242a that extend through the chip 202a to the back surface 222a. The second chip via 242a can be formed with an insulated coating as described above with reference to FIG. 5B. Chip 202a aligns with chip 201a and with the lead inner portions 130 so that first chip via 241a, second chip via 242a, and lead via 140 are coaxially aligned. The alignment assures that second bonding pads 232a make electrical contact with the second surfaces 120 of the lead inner portions 130.

In modified embodiments configured without lead via 140, alternative methods may be employed to create electrical contact between, for example, first surfaces 110 and first bonding pads 231a. For example, a coating of conductive material (e.g., solder) may be provided on first surfaces 110 to enhance adhesion of a first chip via 241a to a first surface 110. Moreover, convex conductive features (e.g., "bumps") may be formed on first surfaces 110 in order to enhance alignment and adhesion of first chip via 241a to first surfaces 110.

Figure 7A:
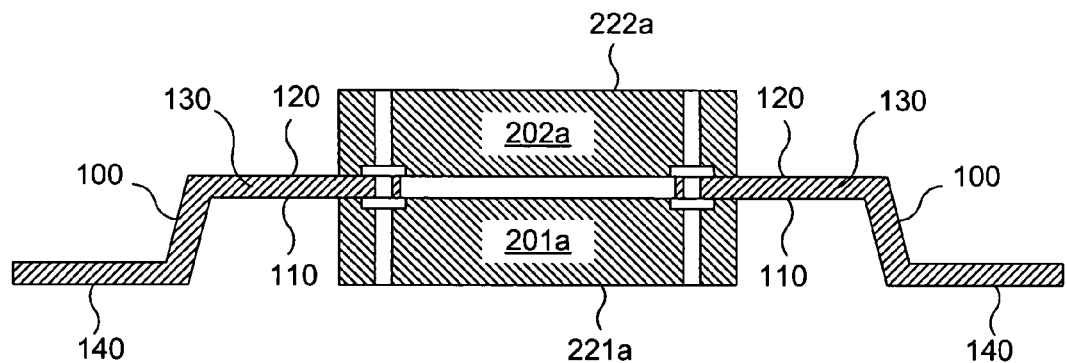
FIGS. 7A-7C are cross-sectional views of embodiments of a stacked structure comprising two chips configured according to the present invention.

FIG. 7A is a cross-sectional view illustrating an embodiment of a two-chip stacked structure fabricated according to the present invention. Generally, this embodiment is configured as illustrated in FIG. 6 except that leads 100 are shown as well. Each lead 100 comprises an lead inner portion 130 as already described and an outer portion 135. The lead inner portion 130 may comprise lead via 140 that are coaxially aligned with first chip via 241a and second chip via 242a. The outer portions 135 may serve to provide a reliable electrical and mechanical connection to a substrate such as a printed circuit board (PCB). The illustrated embodiment exposes the respective back surfaces 221a and 222a of chips 201a and 202a, respectively, thereby enhancing dissipation of heat generated by the chips 201a and 202a. It should be noted that the embodiment illustrated in FIG. 7A has no active surface or wiring exposed. Therefore, this embodiment has no need of any encapsulation to protect components of the structure. The absence of encapsulation may promote increased thermal dispersion of heat generated by chips 201a and 202a.

Figure 7B:
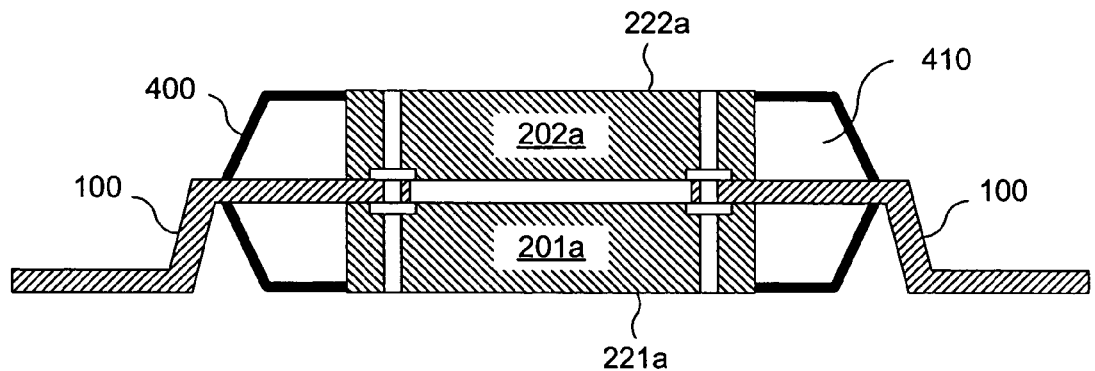

FIG. 7B is a cross-sectional view of another embodiment of a two-chip stacked structure. This embodiment is similar to the embodiment illustrated in FIG. 7A except that parts chips 201a and 202a and parts of the leadframe are at least partially encompassed in an enclosure 400. A portion of a region 410 internal to the enclosure 400 may be filled with, for example, a molding resin, encapsulating the chips 201a and 202a and lead inner portions. The enclosure 400 in this embodiment encloses the lead inner portions 130 (FIG. 7A), but does not enclose the respective back surfaces 221a and 222a of chips 201a and 202a, respectively. Thermal dispersion of heat generated by the chips 201a and 202a is enhanced by the exposure of the back surfaces 221a and 222a.

Figure 7C:
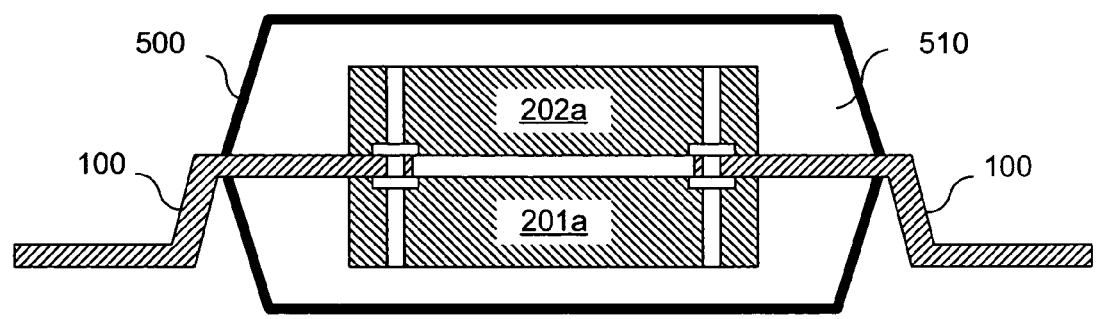

FIG. 7C is a cross-sectional view of yet another embodiment of a two-chip stacked structure. This embodiment is similar to FIG. 7B except that an enclosure 500 surrounds all surfaces of the chips 201a and 202a. A region 510 is formed by the enclosure, wherein a material such as molding resin may occupy a portion of the region 510, encapsulating the chips 201a and 202a and lead inner portions.

Figure 7D:
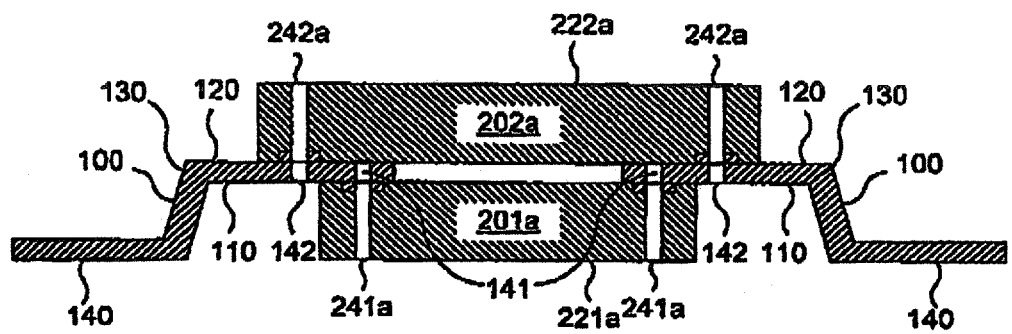
FIGS. 7D and 7E are cross-sectional views of modified embodiments of a stacked structure comprising two chips not having coaxially aligned chip via.
Figure 7E:
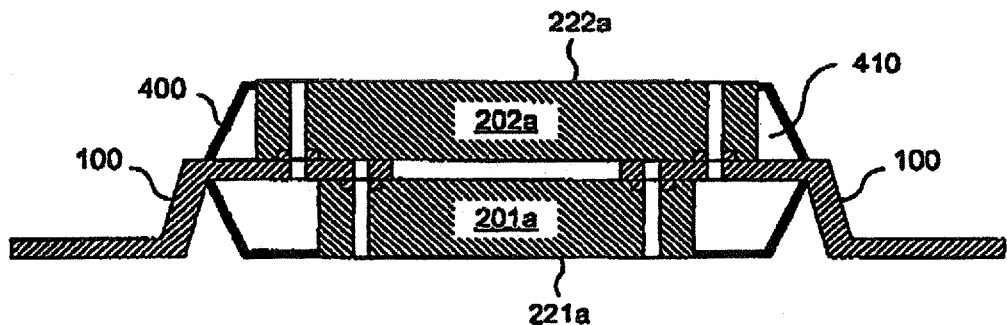

FIGS. 7D and 7E illustrate examples of modified embodiments of the two-chip structures illustrated in, respectively, FIGS. 7A and 7B, wherein first chip via 241a are not coaxially aligned with second chip via 242a. The lead inner portions 130 in the embodiment illustrated in FIG. 7D comprise first lead via 141 and second lead via 142. First lead via 141 coaxially align with first chip via 241a; second lead via 142 coaxially align with second chip via 242a. The embodiment illustrated in FIG. 7E is configured in a manner similar to the example shown in FIG. 7D except for the inclusion of an enclosure 400 defining an internal region 410.

Figure 8:
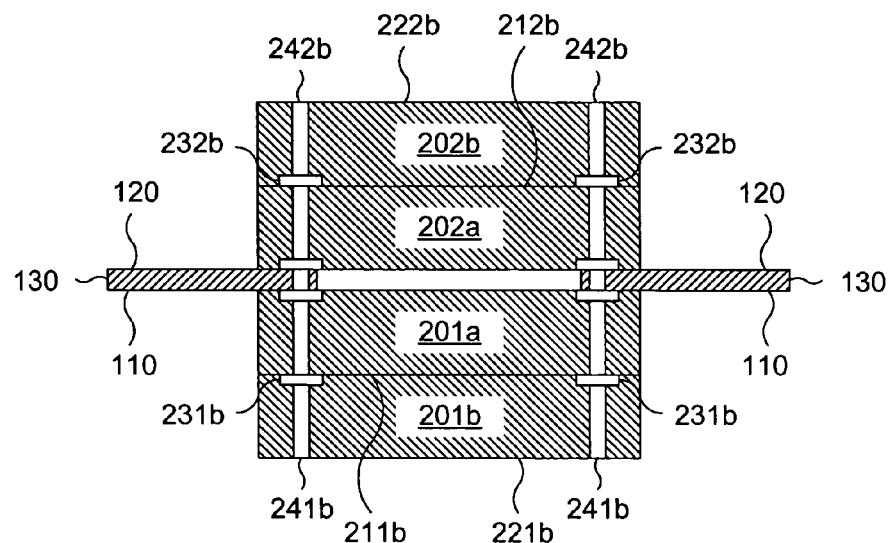
FIG. 8 is a cross-sectional view of an embodiment of four chips connected to a leadframe according to the present invention.

FIG. 8 is a cross-sectional view of an embodiment of four chips connected to a leadframe in accordance with the present invention. This embodiment is similar to the embodiment illustrated in FIG. 6 with the addition of chips 201b and 202b. Chip 201b has an active surface 211b and a corresponding back surface 221b. A plurality of bonding pads 231b is disposed on the active surface 211b. Each bonding pad 231b has associated with it a chip via 241b that extends from the bonding pad 231b to the back surface 221b of the chip 201b. Chip 201b is stacked under chip 201a with the active surface 211b of chip 201b facing and establishing contact with the back surface of chip 201a.

The placement of chip 202b relative to chip 202a is similar to the placement of chip 201b relative to chip 202a. Chip 202b has an active surface 212b and a corresponding back surface 222b. A plurality of bonding pads 232b are disposed on the active surface 212b, each bonding pad 232b being connected to a chip via 242b. The chip via 242b extend from the bonding pads 232b to the back surface 222b. The active surface 212b of chip 202b faces and contacts the back surface 222a (FIG. 6) of chip 202a. Corresponding chip via 241b, 242b, and (see FIG. 6) 241a and 242a as well as lead via 140 are coaxially aligned, thereby facilitating electrical contact among the chips 201a, 201b, 202a, and 202b and the lead inner portions 130. In particular, an electrically conductive material such as solder may be used to fill corresponding chip via 241b, 242b, and (see FIG. 6) 241a, and 242a, thereby providing electrical connection among the bonding pads 231b, 232b, and (see FIG. 6) 231a and 232a. Solder may flow in the lead via 140 (FIG. 6) between first bonding pads 231a and second bonding pads 232a, thereby providing electrical connection as well to the lead inner portions 130. Accordingly, corresponding bonding pads 231b, 231a, 232a, and 232b may be electrically connected to lead inner portions 130 of corresponding leads.

It should be clear from the examples presented herein that the direction in which chips face, i.e. up or down, is not constrained by present description of the invention. Rather, the facing direction of chips can be chosen according to aspects of a particular design or application.

The structure illustrated in FIG. 8 may be extended by providing additional chips having active surfaces, back surfaces, bonding pads, and chip via of the type already described. For example, another chip could be added to the structure by placing the active surface of the additional chip to face either the back surface 221b of chip 201b or the back surface 222b of 202b. Limits to the process of stacking additional chips, if any, may be imposed, for example, by external space considerations.

Figure 9A:
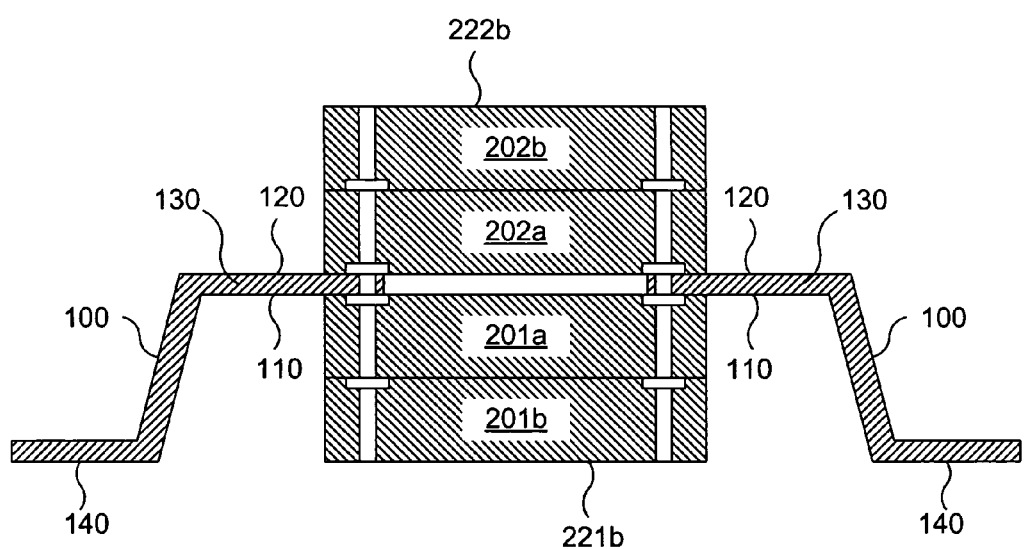
FIGS. 9A-9C are cross-sectional views of implementations of a stacked structure comprising four chips arranged according to the present invention.

FIG. 9A is a cross-sectional view of an embodiment of a four-chip stacked structure configured according to the present invention. The embodiment in FIG. 9A should be compared with the embodiment in FIG. 7A, the substantial difference between the two embodiments being the addition of chips 201b and 202b to the structure illustrated in FIG. 7A. Again, the exposure of back surfaces 221b and 222b in FIG. 9A enhances the ability of the structure to disperse heat generated by the chips. Electrical connection among chips and the leadframe inner leads 110 may be achieved, according to another representative embodiment, by means of conducting material (such as solder) that makes contact with a bonding wall 230a (FIG. 5B). The conducting material further may fill via (e.g., first chip via 241a illustrated in FIG. 5B and chip via 241b illustrated in FIG. 8) and may make electrical contact with inner leads, e.g. inner lead portions 130 illustrated in FIG. 9A.

Figure 9B:
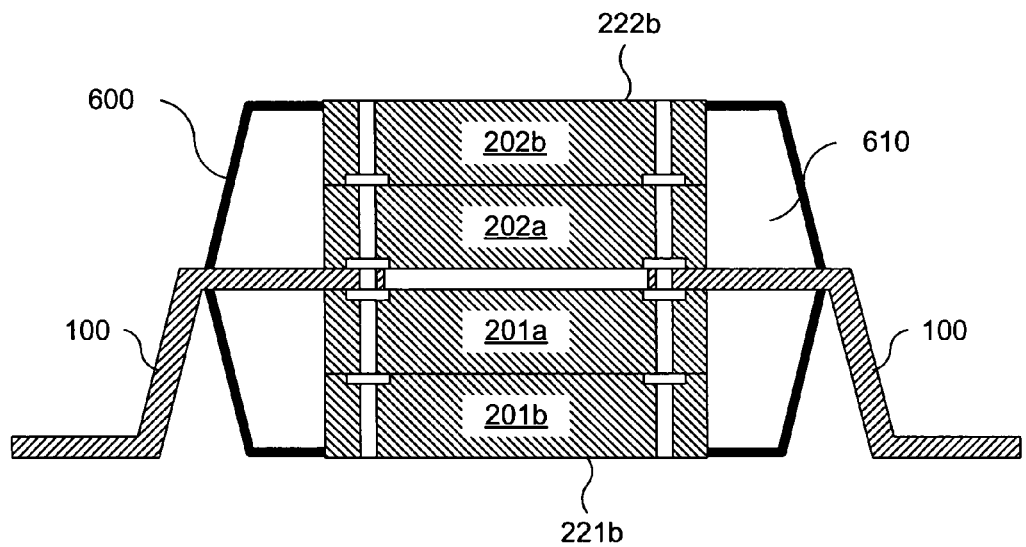

FIG. 9B is a cross-sectional view of a stacked structure embodiment comprising four chips in accordance with the present invention. This embodiment relates to the embodiment illustrated in FIG. 9A by the addition of an enclosure 600 that encloses the chips 201b, 201a, 202a, and 202b and the lead inner portions 130 (FIG. 9A). Molding resin may partially fill an internal region 710 formed by the enclosure. The molding resin may encapsulate the chips 201b, 201a, 202a, and 202b and lead inner portions. Back surfaces 221b and 222b are exposed in this embodiment, to dissipate heat generated by the chips 201b, 201a, 202a, and 202b more efficiently.

Figure 9C:
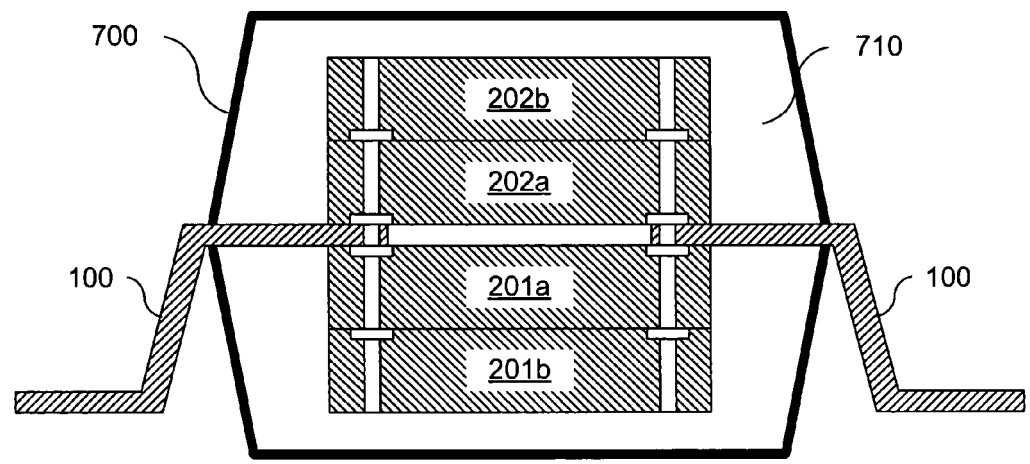

FIG. 9C is a cross-sectional view of another implementation of a four-chip stacked structure. In the present embodiment, all surfaces of chips 201b, 201a, 202a, and 202b are surrounded by an enclosure 700, thereby forming a region 710. As before, molding resin may occupy the region 710 and encapsulate the chips 201b, 201a, 202a, and 202b and lead inner portions.

Figure 9D:
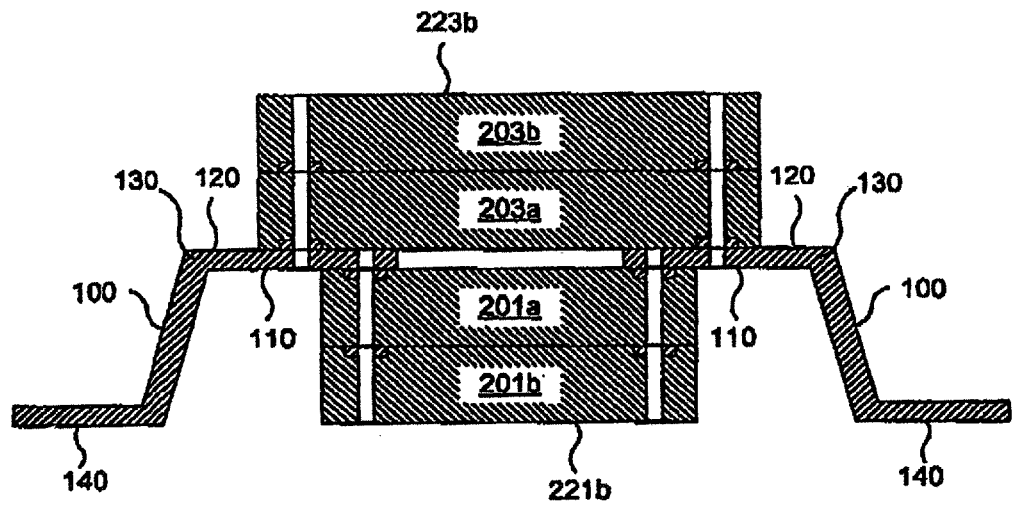
FIGS. 9D and E are cross-sectional views of modified embodiments of a stacked structure comprising two pairs of chips, the chip via of one pair not being coaxially aligned with chip via of the other pair of chips.
Figure 9E:
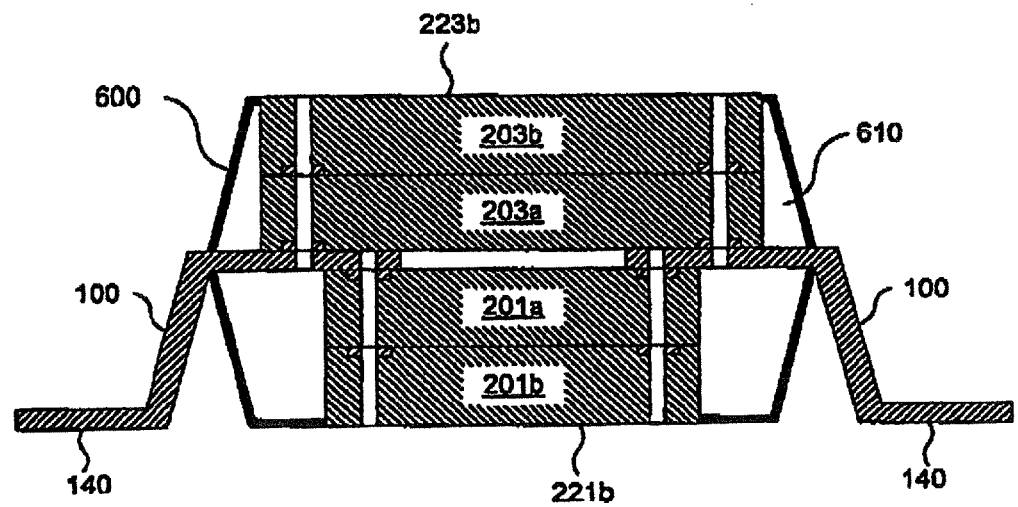
FIG. 9F is a cross-sectional view of a stacked chip structure attached to one side of a lead frame according to the present invention.
Figure 9F:
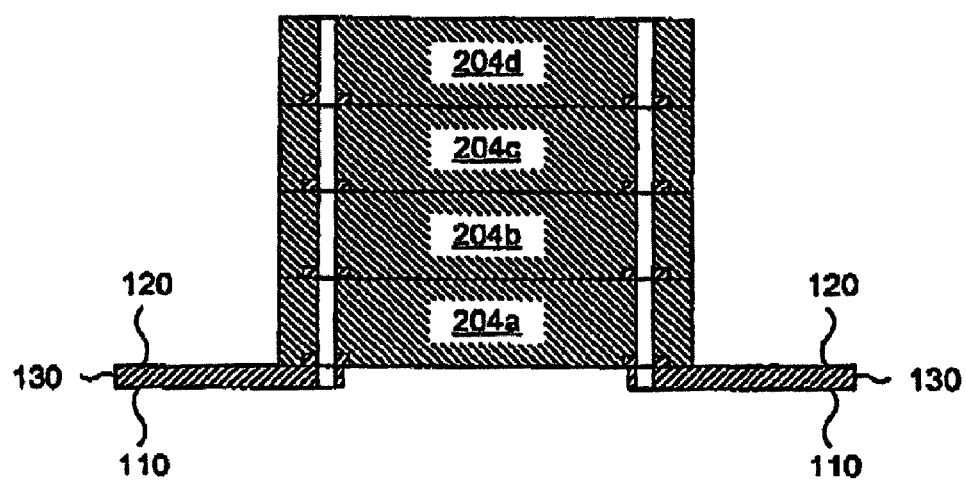

FIGS. 9D-9F depict embodiments of other examples of four-chip structures fabricated according to the present invention. The embodiments illustrated in FIGS. 9D and 9E generalize the structures illustrated in respective FIGS. 9A and 9B to cases where first chip via are not coaxially aligned with second chip via. FIGS. 9D and 9E are not described in detail because of their similarity to FIGS. 7D and 7E. FIG. 9F describes another modified embodiment of a four-chip stacking structure fabricated according to the present invention. The four chips 204a-204d illustrated in FIG. 9F are stacked on a single side of the lead inner portions 130 and are connected electrically to the second surfaces 120 of the leads.

Figure 10:
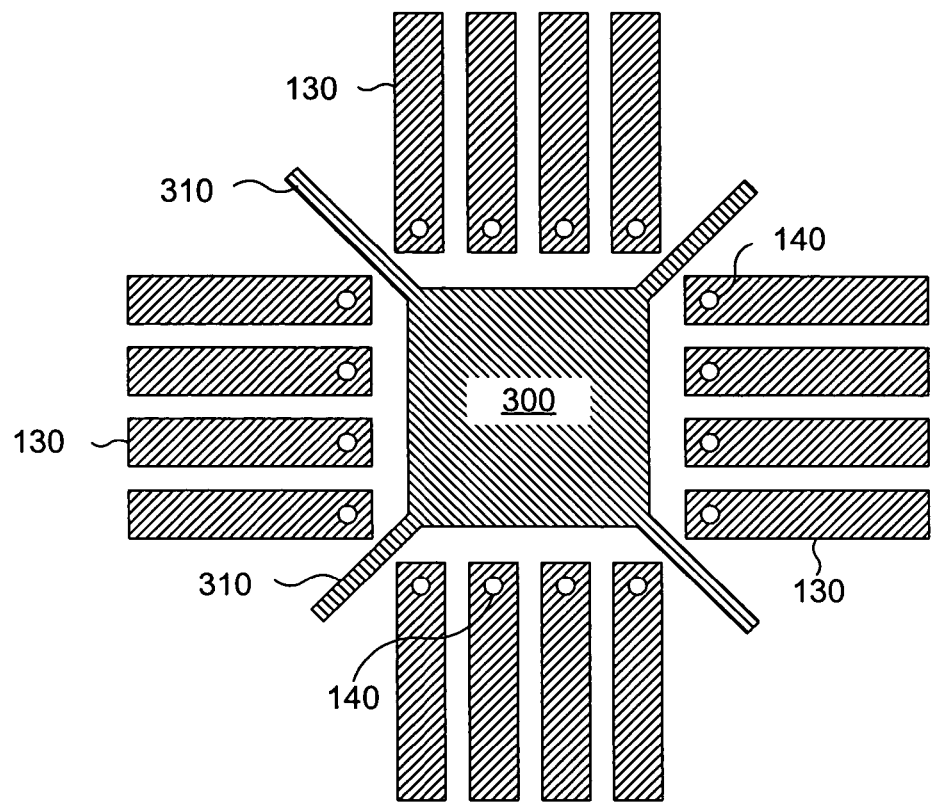
FIG. 10 is a plan view of an embodiment of a leadframe comprising a supporting pad according to the present invention.

FIG. 10 is a plan view of an embodiment of a leadframe comprising a supporting pad 300 according to the present invention. The supporting pad 300 in the illustrated embodiment comprises at least one elongated chip supporting bar 310. (Four elongated chip supporting bars 310 are illustrated in FIG. 10.) The leadframe further comprises leads having lead inner portions 130 and lead via 140 as described above with reference to FIG. 1.

Figure 11:
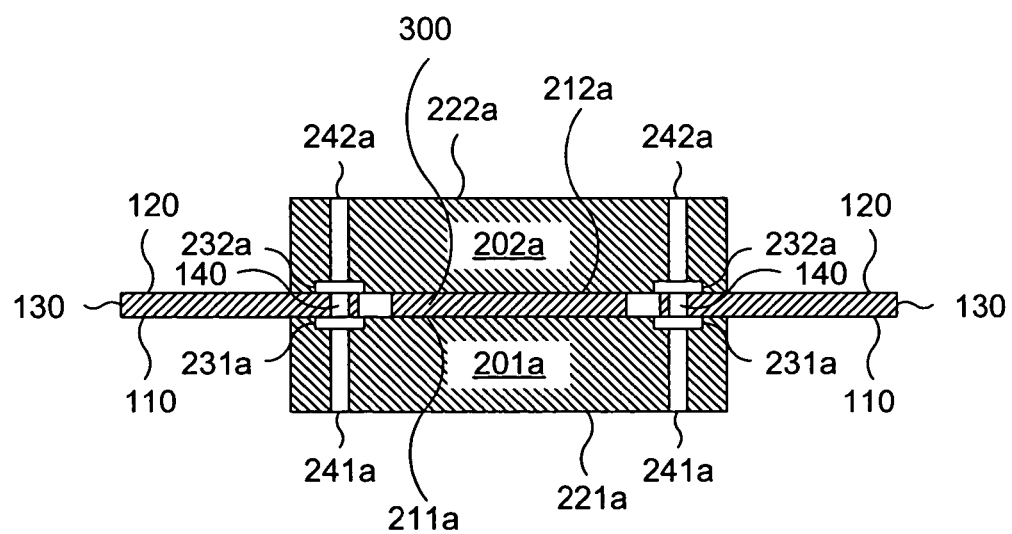
FIG. 11 is a cross-sectional view of an embodiment of two chips connected to a leadframe that comprises a supporting pad according to the present invention.
Figure 12A:
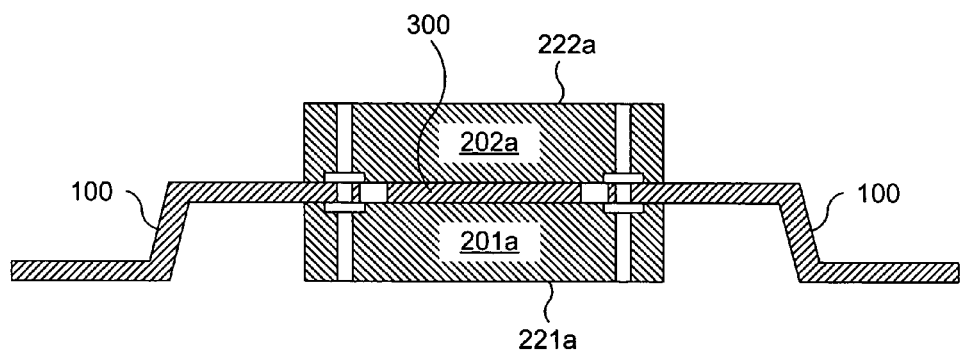
FIGS. 12A-12C are cross-sectional views of embodiments of a stacked structure comprising four chips combined with a leadframe having a supporting pad according to the present invention.
Figure 12B:
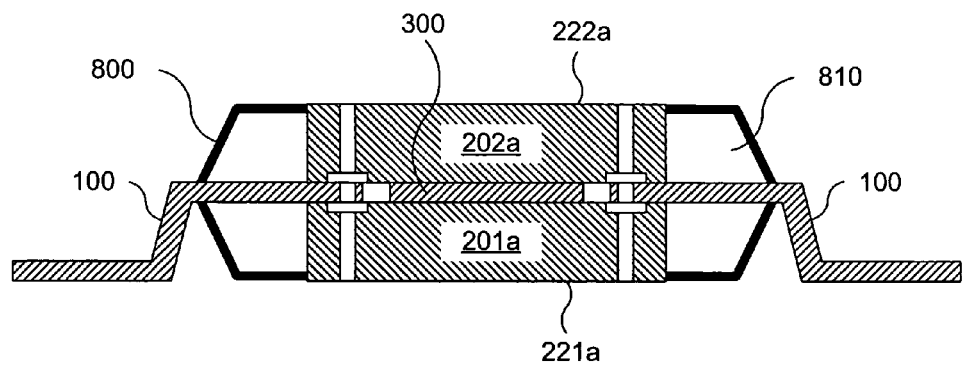
Figure 12C:
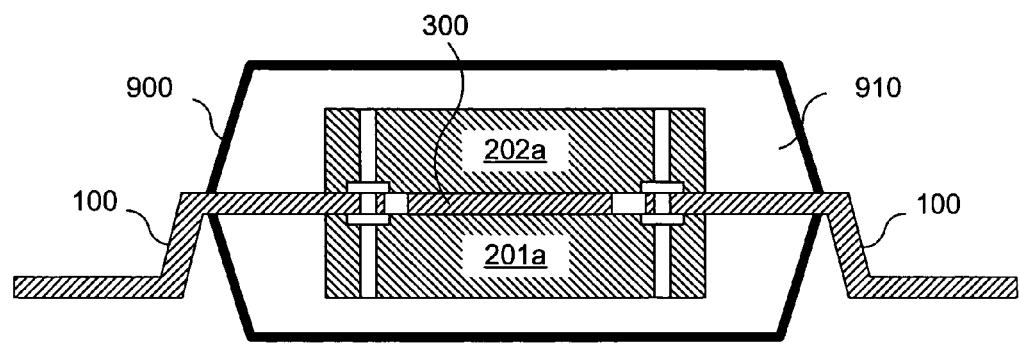
Figure 13:
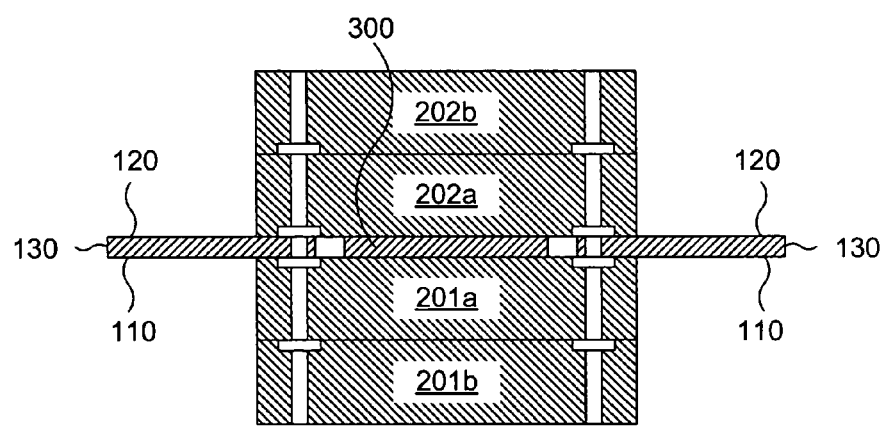
FIG. 13 is a plan view of a four-chip stacked structure formed on a leadframe having a supporting pad according to the present invention.

FIG. 11 is a cross-sectional view of an embodiment of two chips 201a and 202a connected to a leadframe that comprises a supporting pad 300 according to the present invention. The illustrated embodiment is similar to the embodiment described above with reference to FIG. 6, but differs by the provision of the supporting pad 300. The active surfaces 211a and 212a of chips 201a and 202a may be secured to the supporting pad 300 in a manner such that the supporting pad 300 does not interfere with first bonding pads 231a and second bonding pads 232a. In typical embodiments, the active surfaces 211a and 212a are secured to opposite surfaces of the supporting pad 300 by a non-conducting adhesive. The non-conductive adhesive may be either a solid or a liquid.

Figure 14A:
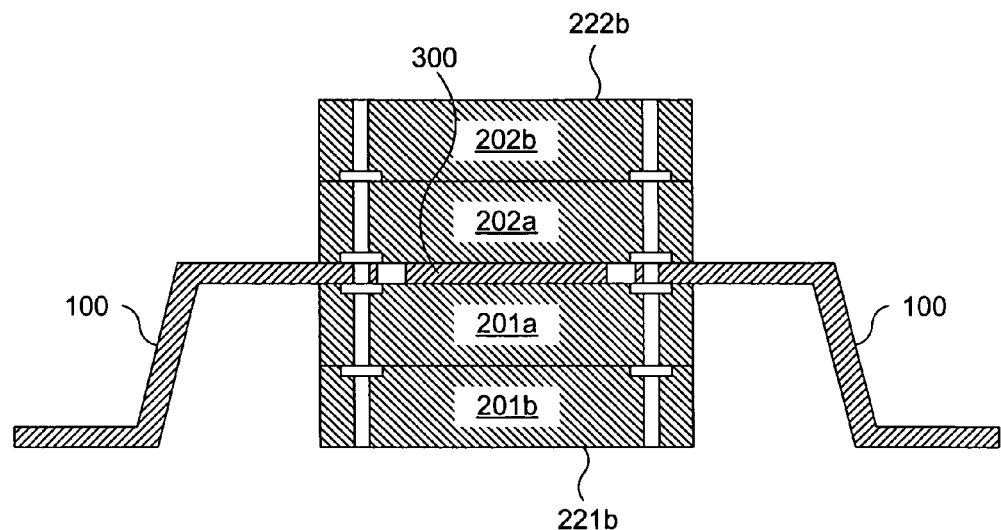
FIGS. 14A-14C are cross-sectional views of stacked structures comprising four chips in an embodiment comprising a leadframe having a supporting pad.
Figure 14B:
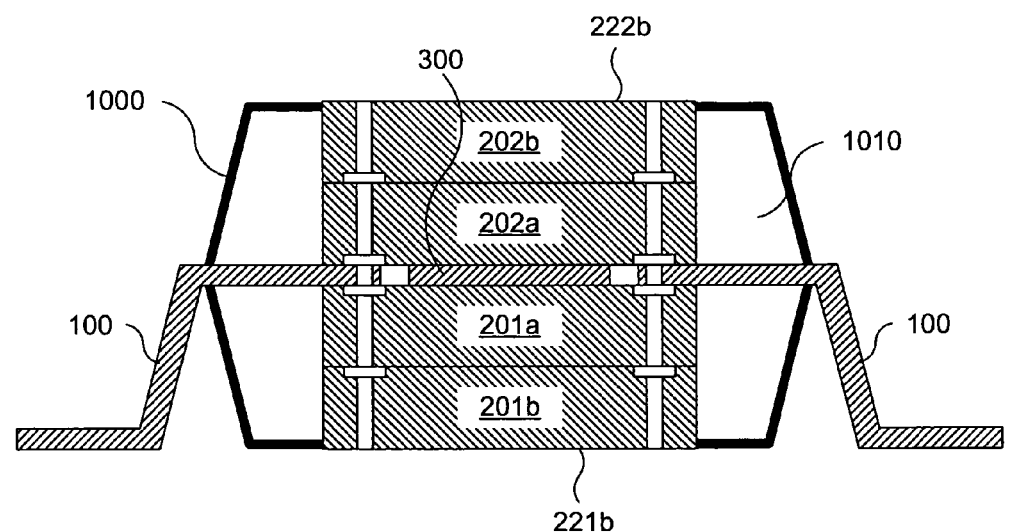
Figure 14C:
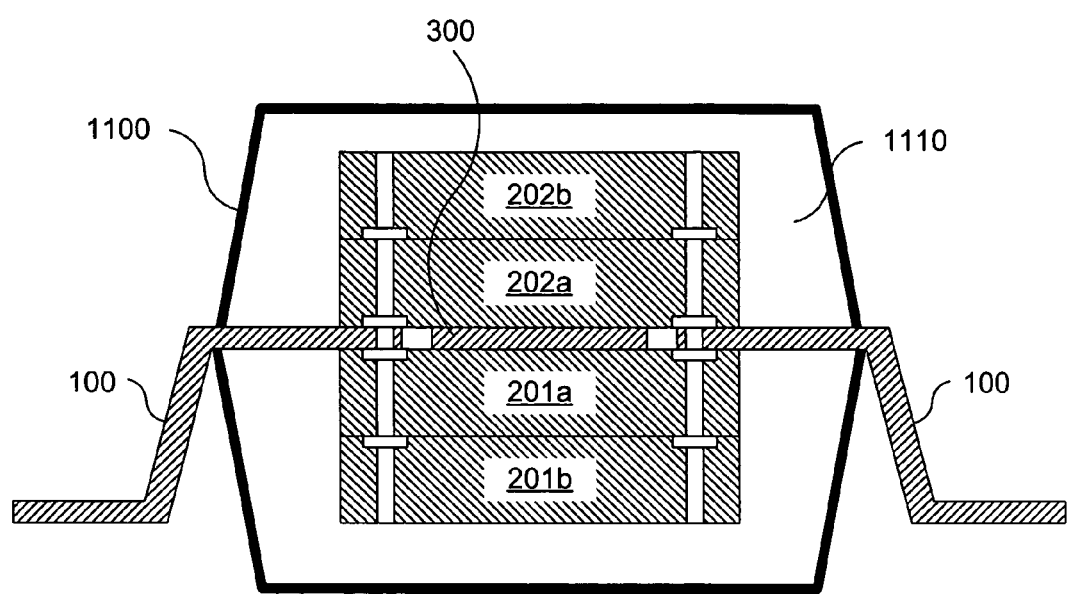
Figure 14D:
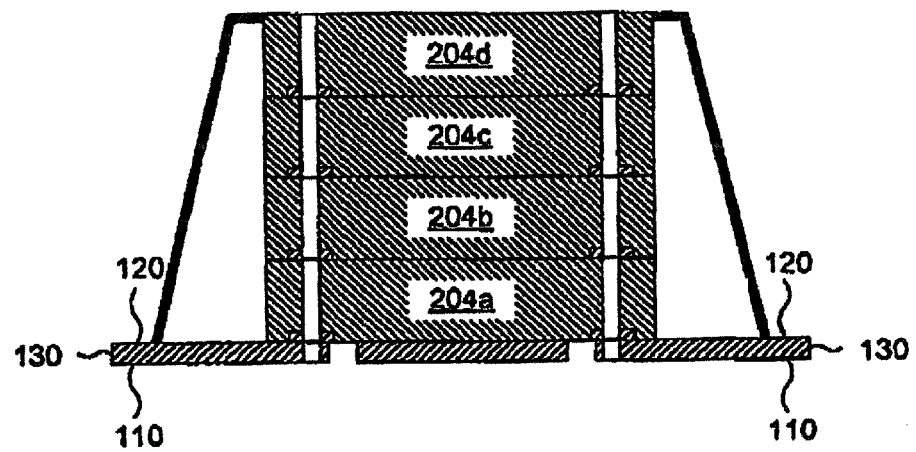
FIGS. 14D and 14E are cross-sectional views of single-sided stacked structures fabricated according to the present invention.
Figure 14E:
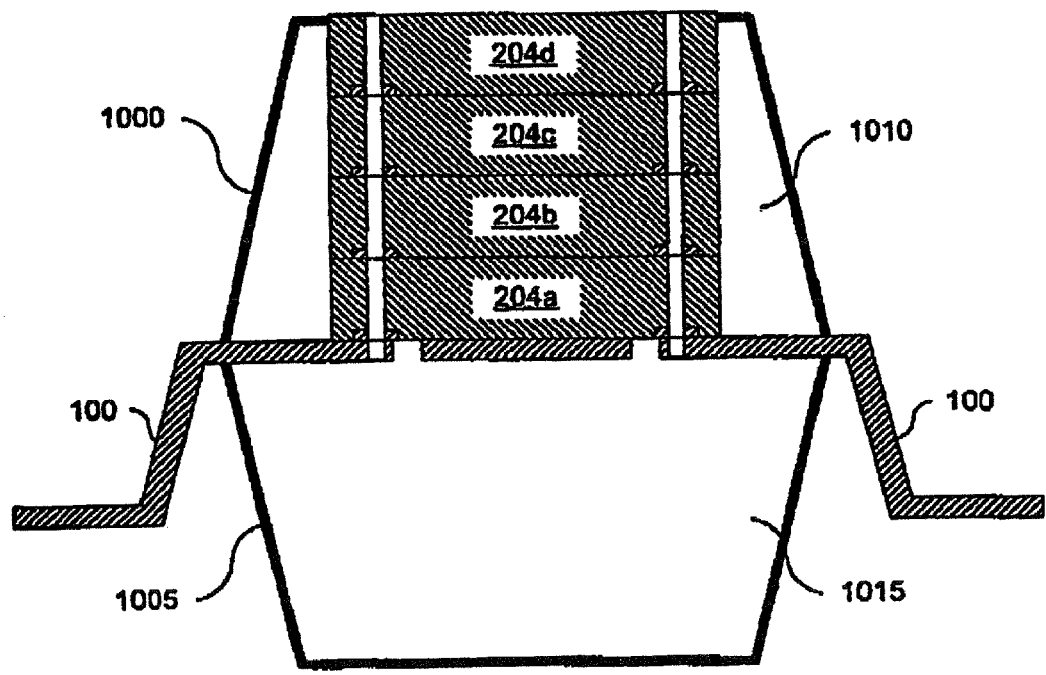

FIGS. 12A-12C, 13, and 14A-14D are cross-sectional diagrams illustrating embodiments of various forms of stacked structures that include a supporting pad 300. These embodiments are similar to the embodiments described with reference to respective FIGS. 7A-7C, 8, 9A-9C, and 9F except for the inclusion of a supporting pad 300 as described above with reference to FIGS. 10 and 11. FIG. 14E is a modified configuration of FIG. 14D, wherein an upper enclosure 1000 and a lower enclosure 1005 define an upper internal region 1010 and a lower internal region 1015, respectively.

Figure 15:
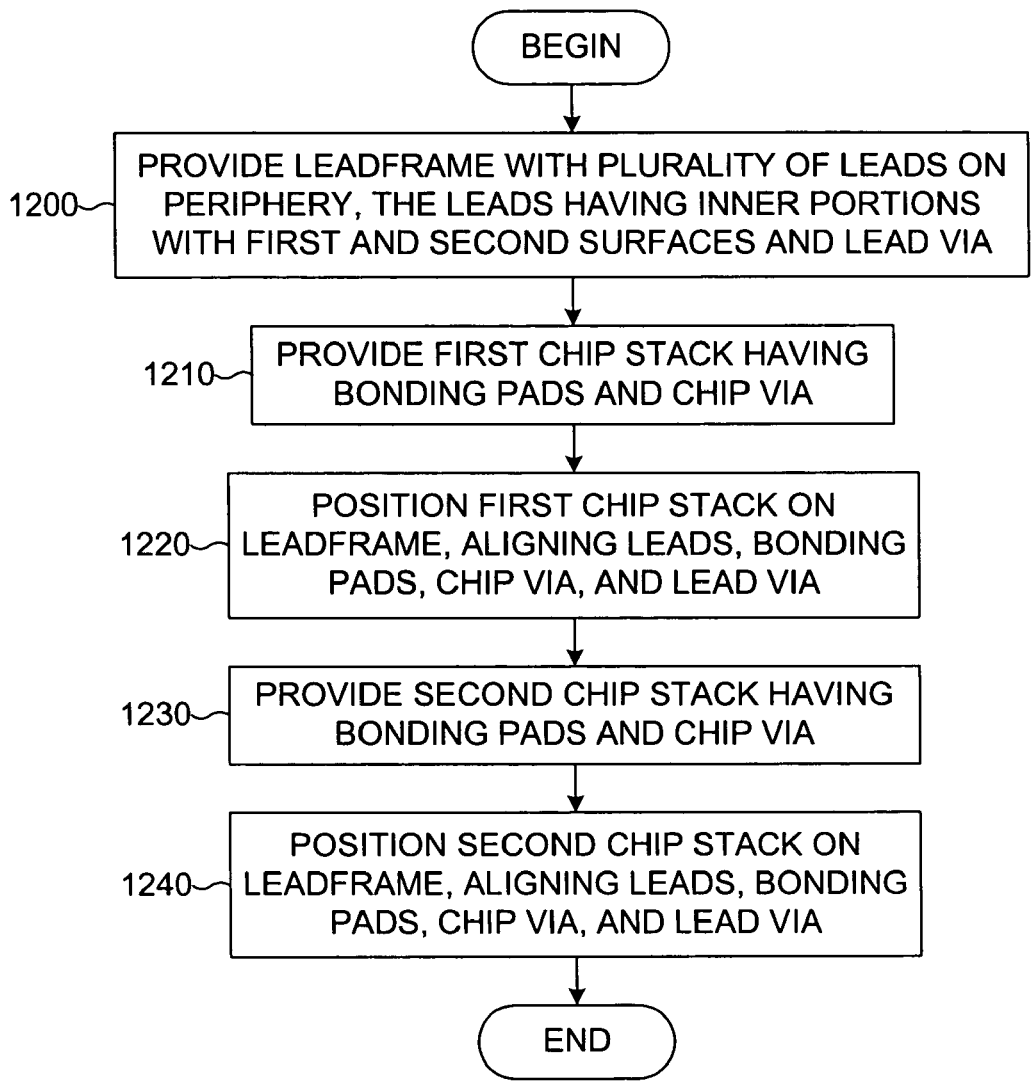
FIG. 15 is a flow diagram that describes an implementation of a method of forming a stacked chip structure according to the present invention.

FIG. 15 is a flow diagram that describes an implementation of a method of forming a stacked chip structure according to the present invention. According to the illustrated implementation, a leadframe is provided at step 1200. An exemplary embodiment of a portion of such a leadframe is illustrated in FIG. 1. The leadframe typically comprises a collection of leads having lead inner portions 130 and may comprise lead via 140 as already described. The lead inner portions 130 have first and second surfaces 110 and 120 as illustrated in FIG. 4. A first chip stack, having bonding pads and first chip via, is provided at step 1210, the first chip stack comprising at least one chip 201a as illustrated in FIG. 4. As another example, a two-chip stack comprising chips 201a and 201b is illustrated in FIG. 8. The first chip stack is positioned on the leadframe at step 1220. Referring to FIG. 4 as an example, the chip stack may be positioned with first chip via 241a aligned with lead via 140. The chip stack is placed such that first bonding pads 231a on the active surface 211a of the chip 201a make contact with first surfaces 110 of the lead inner portions 130. The alignment of first chip via 241a and lead via 140 assures that first bonding pads 231a are aligned with and make electrical contact with the lead inner portions 130. A second chip stack, likewise having bonding pads and chip via, is provided at step 1230. As illustrated in FIG. 6, the second chip stack may comprise at least one chip 202a. The second chip stack is positioned on the leadframe at step 1240. As with the placement of the first chip stack, the second chip stack is positioned such that second bonding pads 232a on active surface 212a of chip 202a contact second surfaces 120 of the lead inner portions 130. Second chip via 242a are aligned with lead via 140. This arrangement provides electrical contact between second bonding pads 232a and the lead inner portions 130.

In view of the foregoing, it will be understood by those skilled in the art that the methods of the present invention can facilitate formation of efficient stacking structures for integrated circuits. The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, the embodiments illustrated in FIGS. 3, 4, 6, 7A-7E, 8, 9A-9F, 11, 12A-12C, 13, and 14A-14D illustrate chips and chip stack sets having an active surface that faces the leadframe inner lead surface. Other embodiments may comprise chips or chip stacks having one or more back surfaces that face the leadframe inner lead surface.

Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A chip stacking structure, comprising:
a leadframe having a plurality of leads disposed at a periphery thereof, each lead having a lead inner portion and a lead outer portion, each lead inner portion having a first surface and a second surface, each lead inner portion having a lead via, the lead via extending from the first surface to the second surface;
a first chip stack comprising at least one chip, each chip in the first stack having an active surface, a back surface, a plurality of first bonding pads having bonding walls and being disposed on the active surface, and a plurality of first chip via having inner walls with insulating material and extending from first bonding pads through the chip to the back surface;
a second chip stack comprising at least one chip, each chip in the second stack having an active surface, a back surface, a plurality of second bonding pads having bonding walls and being disposed on the active surface, and a plurality of second chip via having inner walls with insulating material and extending from second bonding pads through the chip to the back surface; and
conducting material within the first chip via, the lead via, and the second chip via, the conducting material electrically connecting first bonding pads to first surfaces of lead inner portions and electrically connecting second bonding pads to second surfaces of lead inner portions.

2. The chip stacking structure as set forth in claim 1, wherein the insulation material of the inner walls of the first chip via and the second chip via does not extend onto the bonding walls of the first bonding pads and the second bonding pads.

3. The chip stacking structure as set forth in claim 1, wherein the first chip stack is positioned with first chip via facing the leadframe and the second chip stack is positioned with second chip via facing the leadframe.

4. The chip stacking structure as set forth in claim 1, wherein the first chip stack comprises a first chip and a second chip, the active surface of the second chip being joined to the back surface of the first chip.

5. The chip stacking structure as set forth in claim 1, wherein the second chip stack comprises a first chip and a second chip, the active surface of the second chip being joined to the back surface of the first chip.

6. The chip stacking structure as set forth in claim 5, wherein each lead inner portion is elongated to reach a bond pad on an active surface.

7. The chip stacking structure as set forth in claim 1, wherein each first surface is aligned with a first chip via, and each second surface is aligned with a second chip via.

8. The chip stacking structure as set forth in claim 7, wherein the plurality of first chip via are not coaxially aligned with the plurality of second chip via.

9. The chip stacking structure as set forth in claim 7, wherein the plurality of first chip via are coaxially aligned with the plurality of second chip via.

10. The chip stacking structure as set forth in claim 7, wherein: the first chip stack comprises at least two chips; the first chip via of the at least two chips are coaxially aligned; the second chip stack comprises at least two chips; and the second chip via of the at least two chip of the second stack are coaxially aligned.

11. The chip stacking structure as set forth in claim 10, and further comprising conductive material disposed on first surfaces and second surfaces to enhance adhesion of first chip via and second chip via to the respective first surfaces and second surfaces.

12. The chip stacking structure as set forth in claim 10, wherein: first surfaces comprise convex conductive features that enhance alignment and adhesion of first chip via with the first surfaces; and second surfaces comprise convex conductive feature that enhance alignment and adhesion of second chip via with the second surfaces.

13. The chip stacking structure as set forth in claim 10, further comprising a plurality of elements electrically connecting the bonding pads of chips that form a chip stack to corresponding lead via.

14. The chip stacking structure as set forth in claim 13, wherein the elements comprise solder.

15. The chip stacking structure as set forth in claim 10, wherein each lead via is coaxially aligned with at least one of a first chip via and a second chip via.

16. The chip stacking structure as set forth in claim 1, wherein the lead outer portions are capable of providing connection to a substrate.

17. The chip stacking structure as set forth in claim 1, wherein the lead outer portions are capable of providing connection to a printed circuit board.

18. The chip stacking structure as set forth in claim 1, further comprising an enclosure that surrounds at least part of the first and second chip stacks and at least part of the leadframe.

19. The chip stacking structure as set forth in claim 18, further comprising molding resin encapsulating at least part of the first and second chip stacks and at least part of the leadframe.

20. The chip stacking structure as set forth in claim 19, wherein the back surface of at least one chip is exposed.

21. The chip stacking structure as set forth in claim 1, wherein the leadframe comprises a supporting pad attached to at least one active surface in a manner that does not interfere with bonding pads disposed on the at least one active surface, the supporting pad being attached by one of a solid or liquid non-conductive adhesive.

22. A chip stacking structure, comprising:
a plurality of chip stacks, each chip stack including at least one chip, each chip having an active surface, a corresponding back surface, a plurality of bonding pads having bonding walls and being disposed on the active surface, and a plurality of chip via having inner walls and extending from the plurality of bonding pads through the chip to the back surface, wherein insulating material covers inner walls but not bonding walls;
a leadframe having a plurality of leads disposed at a periphery thereof, the plurality of leads having lead inner portions and lead outer portions, the lead inner portions having first surfaces and second surfaces, each lead inner portion having a lead via, the lead via extending from the first surface to the second surface, wherein a first chip stack is positioned with a first active surface facing the first surfaces and with a first plurality of bonding pads aligned with and making contact with the lead inner portions, and wherein a second chip stack is positioned with a second active surface facing the second surfaces and with a second plurality of bonding pads aligned with and making contact with the lead inner portions; and
conductive material electrically connecting bonding walls in the first chip stack to the first surfaces, and electrically connecting bonding walls in the second chip stack to the second surfaces.

23. The chip stacking structure as set forth in claim 22, wherein: the plurality of chip via are coaxially aligned with the lead via.

24. The chip stacking structure as set forth in claim 23, wherein the active surface of each chip is disposed to face one of a lead inner portion and a back surface of another chip.

25. The chip stacking structure as set forth in claim 23, wherein: the plurality of chip via in chips in the first chip stack is coaxially aligned; and the plurality of chip via in chips in the second chip stack is coaxially aligned.

26. The chip stacking structure as set forth in claim 25, wherein the plurality of bonding pads on chips in the plurality of chip stacks are electrically connected to the plurality of leads.

27. The chip stacking structure as set forth in claim 26, wherein conductive material connects the plurality of bonding pads through the plurality of chip via to the lead via, thereby electrically connecting the plurality of bonding pads to the plurality of leads.

28. The chip stacking structure as set forth in claim 27, wherein the conductive material comprises solder.

29. The chip stacking structure as set forth in claim 22, wherein the lead outer portions are electrically connected to a printed circuit board.

30. The chip stacking structure as set forth in claim 22, further comprising an enclosure that surrounds at least part of the plurality of chip stacks and at least part of the leadframe.

31. A chip stacking structure, comprising:
a chip stack comprising at least one chip, each chip having an active surface, a plurality of bonding pads having a plurality of bonding walls formed on the active surface, a back surface, and at least one chip via having insulating material formed on inner walls but not bonding walls;
a leadframe having a plurality of leads disposed at a periphery thereof, the plurality of leads having lead outer portions and lead inner portions with conducting surfaces, each lead inner portion having a lead via; and
conducting material filling the lead via and electrically connecting the at least one chip via to at least one conducting surface.

32. The chip stacking structure as set forth in claim 31, wherein the chip stack comprises at least a first chip and a second chip, the active surface of the second chip being joined to the back surface of the first chip.

33. The chip stacking structure as set forth in claim 32, wherein the lead via is coaxially aligned with the at least one chip via.

34. The chip stacking structure as set forth in claim 33, wherein: the chip stacking structure further comprises a plurality of connections formed of conductive material disposed between the lead via and plurality of bonding pads of the at least one chip that forms a chip stack.

35. The chip stacking structure as set forth in claim 31, wherein the conducting surfaces have formed thereon a conductive material coating to enhance adhesion of the at least one chip via to the conducting surfaces.

36. The chip stacking structure as set forth in claim 35, wherein the conductive material comprises a convex conductive feature that enhances adhesion and alignment of the conducting surfaces with the at least one chip via.

37. The chip stacking structure as set forth in claim 31, wherein the lead outer portions are capable of providing connection to a substrate.

38. The chip stacking structure as set forth in claim 31, further comprising an encapsulation that surrounds at least part of the chip stack and at least a portion of the leadframe.

39. The chip stacking structure as set forth in claim 38, wherein the back surface of at least one chip is exposed, thereby enhancing thermal dispersion.

40. A chip stacking structure, comprising:
at least one chip stack, including at least one chip having an active surface, a corresponding back surface, a plurality of bonding pads disposed on the active surface, and a plurality of chip via extending from the bonding pads through the chip to the back surface;
a leadframe having a plurality of leads disposed at a periphery thereof, wherein each lead comprises a lead via, the plurality of leads having a plurality of lead inner portions and a plurality of lead outer portions, the plurality of lead inner portions having a plurality of first surfaces and a plurality of second surfaces, each lead inner portion having a lead via, the lead via extending from the first surface to the second surface, wherein the at least one chip stack is positioned with a first active surface facing the plurality of first surfaces with a first plurality of bonding pads aligned with and making contact with the plurality of lead inner portions;

adhesive material securing at least one of an active surface and a back surface of at least one chip to at least one of the plurality of first surfaces and the plurality of second surfaces; and conductive material within the chip via, the lead via, and the lead via electrically connecting the plurality of bonding pads to at least one of the plurality of first surfaces and the plurality of second surfaces.

* * * * *